United States Patent
Nagano

(10) Patent No.: US 8,357,895 B2
(45) Date of Patent: Jan. 22, 2013

(54) DEFECT INSPECTION APPARATUS, DEFECT INSPECTION METHOD, AND SEMICONDUCTOR DEVICE MANUFACTURING METHOD

(75) Inventor: Osamu Nagano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 437 days.

(21) Appl. No.: 12/561,109

(22) Filed: Sep. 16, 2009

(65) Prior Publication Data

US 2010/0081217 A1 Apr. 1, 2010

(30) Foreign Application Priority Data

Sep. 26, 2008 (JP) .................... 2008-247655

(51) Int. Cl.
*H01J 37/28* (2006.01)

(52) U.S. Cl. .............. 250/310; 250/307; 250/396 R; 250/396 ML; 250/398; 324/754.22

(58) Field of Classification Search .......... 250/310, 250/307, 396 R, 396 ML, 398; 324/754.22
See application file for complete search history.

(56) References Cited

U.S. PATENT DOCUMENTS

| | | | | | |
|---|---|---|---|---|---|
| 4,321,468 | A | * | 3/1982 | Kimura | 250/307 |
| 5,117,111 | A | * | 5/1992 | Nakamura et al. | 250/310 |
| 5,498,874 | A | * | 3/1996 | Miyoshi et al. | 250/397 |
| 5,576,833 | A | * | 11/1996 | Miyoshi et al. | 356/394 |
| 6,576,902 | B2 | * | 6/2003 | Kuwahara | 250/310 |
| 7,161,158 | B2 | * | 1/2007 | Shemesh et al. | 250/396 R |
| 2009/0039257 | A1 | * | 2/2009 | Essers et al. | 250/307 |

FOREIGN PATENT DOCUMENTS

| | | |
|---|---|---|
| JP | 1-283929 | 11/1989 |
| JP | 7-181297 | 7/1995 |
| JP | 7-249393 | 9/1995 |
| JP | 11-67134 | 3/1999 |
| JP | 2001-185592 | 7/2001 |
| JP | 2006-156247 | 6/2006 |
| JP | 2007-256225 | 10/2007 |
| WO | WO 02/45153 | 6/2002 |

OTHER PUBLICATIONS

Notification of Reasons for Rejection issued by the Japanese Patent Office on Jan. 21, 2011, for Japanese Patent Application No. 2008-247655, and English-language translation thereof.
Shimada, A. et al., "Application of μLoop™ Method to Killer Defect Detection and In-Line Monitoring for FEOL Process of 90nm-node Logic Device," 4 Sheets, (2006).

(Continued)

*Primary Examiner* — Jack Berman
(74) *Attorney, Agent, or Firm* — Finnegan, Henderson, Farabow, Garrett & Dunner, L.L.P.

(57) ABSTRACT

A defect inspection method includes generating and applies a charged beam to a sample with patterns; controlling a shape of the charged beam so that a beam width in a first direction perpendicular to an optical axis differs from a beam width in a second direction perpendicular to the optical axis and the first direction, while substantially maintaining a cross-sectional area of the beam; scanning the sample with the charged beam having the controlled shape; and detecting charged particles from the sample by irradiation of the charged beam and detects a defect of the patterns. Assuming that the beam width of the charged beam in the first direction is smaller than that in the second direction, the first direction is set to a direction in which an interval between adjacent patterns becomes a minimum value and the sample is scanned in the second direction.

24 Claims, 12 Drawing Sheets

OTHER PUBLICATIONS

Matsui, M. et al., "In-Line Inspection Resistance Mapping Using Quantitative Measurement of Voltage Contrast in SEM Image," Proc. of SPIE, vol. 6922, pp. 692218-1 to 692218-8, (2008).

Shaw, J. et al., "Rapid Interconnect Development Using an Area Accelerated Electron Beam Inspection Methodology," IEEE, International Interconnected Technology Conference, pp. 33-35, (2002).

Decision of Final Rejection issued by the Japanese Patent Office on Aug. 5, 2011, for Japanese Patent Application No. 2008-247655, and English-language translation thereof.

Notification of Reasons for Rejection issued by the Japanese Patent Office on Apr. 12, 2011, for Japanese Patent Application No. 2008-247655, and English-language translation thereof.

* cited by examiner

DEFECT INSPECTION APPARATUS, DEFECT INSPECTION METHOD, AND SEMICONDUCTOR DEVICE MANUFACTURING METHOD

CROSS REFERENCE TO RELATED APPLICATIONS

This application claims benefit of priority under 35USC§119 to Japanese patent application No. 2008-247655, filed on Sep. 26, 2008, the contents of which are incorporated by reference herein.

BACKGROUND OF THE INVENTION

1. Field of the Invention

The present invention relates to a defect inspection apparatus, a defect inspection method, and a semiconductor device manufacturing method.

2. Related Background Art

As a method for inspecting the result of a circuit pattern formed on a semiconductor wafer, there is used a method of using a Scanning Electron Microscope (SEM), scanning the top of the wafer with an electron beam, using an SEM image of the circuit pattern obtained by detecting resultant secondary electrons, reflected electrons and back scattering electrons (hereafter referred to as "secondary electrons and the like"), comparing, for example, SEM images of adjacent circuit patterns with each other, calculating a difference between them, and thereby detecting a defect. (For example, Application of μloop™ Method to Killer Defect Detection and In-line Monitoring for FEOL Process of 90 nm—node Logic Device, Akihiro Shimada, Yasuo Matsumiya, Atsuo Fushida, Atsuo Shimizu, Fujitsu Limited, Akiruno Technology Center (hereafter referred to as "non-patent document 1") and In-line Inspection Resistance Mapping Using Quantitative Measurement of Voltage Contrast in SEM images, Miyako Matsui, Yoshihiro Anan, Takayuki Odaka, Hiroshi Nagaishi, and Koichi Sakurai, Central Research Laboratory, Hitachi Ltd., Renesas Technology Corp. (Proc. Of SPIE Vol. 6922, 692218, 2008) (hereafter referred to as "non-patent document 2".))

According to the methods-disclosed in non-patent document 1 and non-patent document 2, pattern defects (open circuits and short circuits) and particles existing in the circuit pattern on the wafer surface are detected as shape contrast or material contrast, and electric defects (open circuits and short circuits) existing on the wafer surface or in an underlying layer are detected as potential contrast of the circuit pattern on the wafer surface.

However, inspection using an electron beam has a problem that inspection time is long, and a higher speed is demanded strongly. On the other hand, inspection using an electron beam has an advantage that inspection can be conducted with high resolution as compared with optical inspection. Improvement of the detection sensitivity of minute defects making the most of this advantage is demanded.

For making the inspection faster, it is necessary to acquire a SEM image without decreasing the signal quantity from a defect by conducting scanning fast with a beam of a large current. On the other hand, for detecting a minute defect, it is necessary to improve the resolution by using a small current to reduce blurring caused by the space charge effect and narrowing down the beam spot size.

In this way, inspection speed increase and resolution improvement are in the relation of trade-off in the conventional inspection technique of SEM scheme. It is difficult to simultaneously achieve both objects contradicting each other because of a physical limit.

In order to solve the above-described problem, there is proposed a method for reducing the number of times of beam scanning and the number of times of stage movement and making the inspection fast by using a rectangular beam which is larger in cross-sectional area than the SEM beam as the electron beam for scanning the wafer and moving a stage in the major axis direction with a pitch coinciding with the length of the major axis length while scanning in the minor axis direction of the rectangular beam by using a deflection system (for example, Japanese Patent Laid-Open Pub. No. 07-249393 (1995)). According to the method disclosed in Japanese Patent Laid-Open Pub. No. 07-249393 (1995), the number of times of beam scanning and the number of times of turn-back are reduced to 1/N because the beam shape is N times long (the area increases) in the major axis direction.

However, the method disclosed in Japanese Patent Laid-Open Pub. No. 07-249393 (1995) is a method which produces the effect when an inspection apparatus of map projection scheme is used and a two-dimensional image can be acquired in the lump without scanning with a beam. If it is attempted to apply the method to an apparatus of SEM scheme simply, the resolution is degraded remarkably, resulting in a problem of poor practicality.

More specifically, according to the method disclosed in Japanese Patent Laid-Open Pub. No. 07-249393 (1995), the resolution in the stage movement direction (Y direction) is remarkably deteriorated due to the magnitude of the size of the electron beam in the stage movement direction as length $\Delta Y$ in the longitudinal direction. For a high-speed inspection, a wide deflection and a high speed scanning are necessary for an inspection apparatus using an electron beam. However, when it is attempted to perform a wide deflection and a high speed scanning by use of a SEM system apparatus through the method disclosed in Japanese Patent Laid-Open Pub. No. 07-249393 (1995), a blur in the beam scanning direction (X direction) would generate due to deflection aberration and distortion in the beam scanning direction (X direction) would generate from problems of scanning power supply and electrostatic charge due to a high speed scanning.

SUMMARY OF THE INVENTION

According to a first aspect of the present invention, there is provided a defect inspection apparatus comprising:

a charged beam irradiation unit which generates a charged beam and applies the charged beam to a sample having a plurality of patterns formed thereon;

a beam shape control unit which controls a shape of the charged beam while substantially maintaining a cross-sectional area of the beam in a manner that a beam width in a first direction perpendicular to an optical axis differs from a beam width in a second direction perpendicular to the optical axis and the first direction;

a scanning unit which scans the sample with the charged beam having the controlled shape; and a defect detection unit which detects charged particles generated from a surface of the sample by irradiation of the charged beam and detects a defect of the patterns, wherein assuming that the beam width of the charged beam in the first direction is smaller than the beam width of the charged beam in the second direction, the scanning unit sets the first direction to a direction in which an interval between adjacent patterns becomes a minimum value and scans an inspection region of the sample in the second direction.

According to a second aspect of the present invention, there is provided a defect inspection method comprising:

generating a charged beam and irradiating a sample on which a plurality of patterns are formed with the charged beam;

controlling a shape of the charged beam applied to the sample so as to cause a beam width in a first direction perpendicular to an optical axis to differ from a beam width in a second direction perpendicular to the optical axis and the first direction, while substantially maintaining a cross-sectional area of the beam;

scanning the sample with the charged beam having the controlled shape; and detecting charged particles generated from a surface of the sample by irradiation of the charged beam and detects a defect of the patterns, wherein assuming that the beam width of the charged beam in the first direction is smaller than the beam width of the charged beam in the second direction, the first direction is set to a direction in which an interval between adjacent patterns becomes a minimum value and an inspection region of the sample is scanned in the second direction.

According to a third aspect of the present invention, there is provided a manufacturing method for semiconductor device comprising:

responsive to judgment that a pattern on a sample for semiconductor device formation satisfies specifications required for the semiconductor device as a result of inspection using a defect inspection method, executing a manufacturing process for the semiconductor device on the sample, the defect inspection method comprising:

generating a charged beam and irradiating a sample on which a plurality of patterns are formed with the charged beam;

controlling a shape of the charged beam applied to the sample so as to cause a beam width in a first direction perpendicular to an optical axis to differ from a beam width in a second direction perpendicular to the optical axis and the first direction, while substantially maintaining a cross-sectional area of the beam;

scanning the sample with the charged beam having the controlled shape; and detecting charged particles generated from a surface of the sample by irradiation of the charged beam and detects a defect of the patterns, wherein assuming that the beam width of the charged beam in the first direction is smaller than the beam width of the charged beam in the second direction, the first direction is set to a direction in which an interval between adjacent patterns becomes a minimum value and an inspection region of the sample is scanned in the second direction.

DETAILED DESCRIPTION OF THE INVENTION

Figure 1:
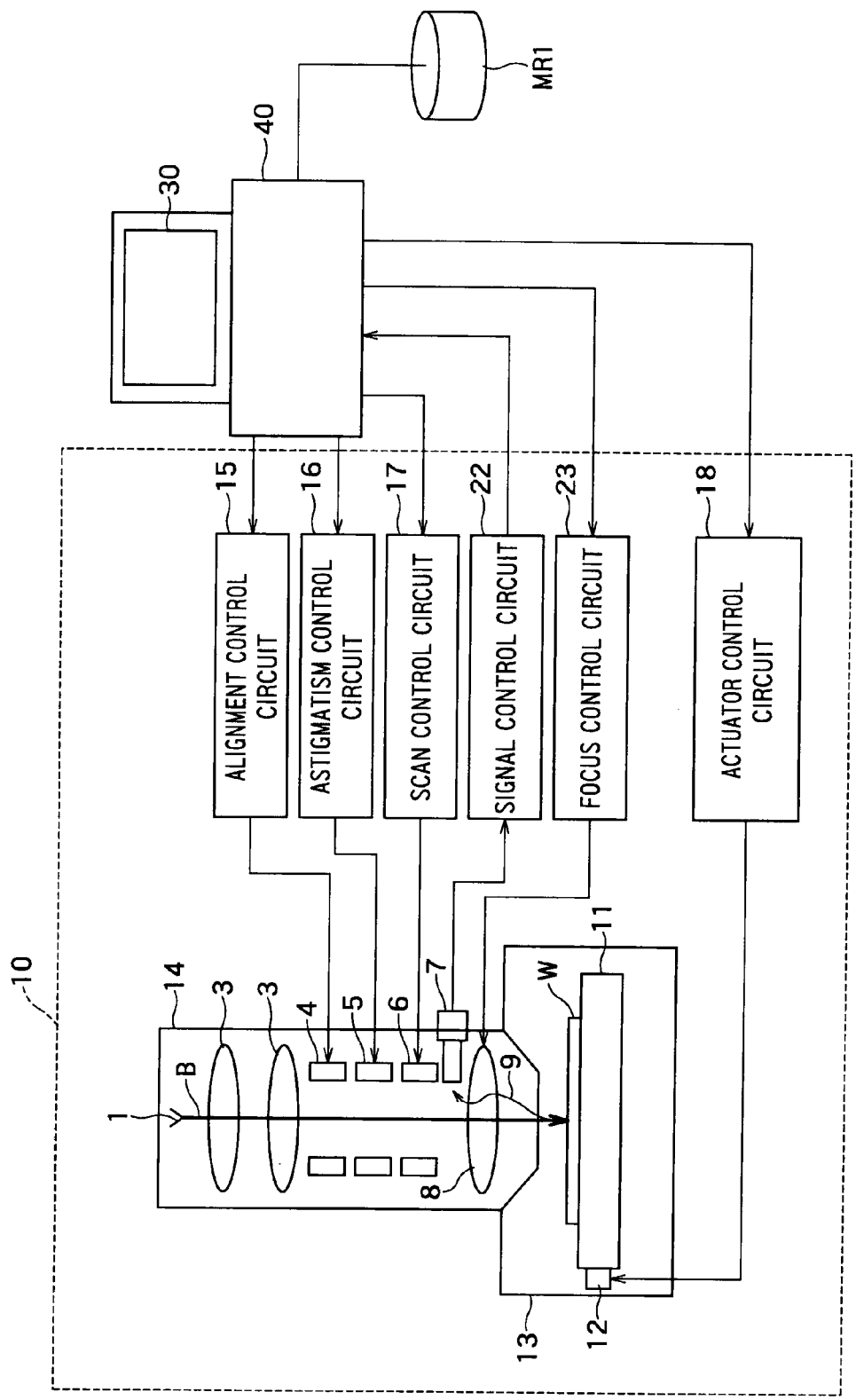
FIG. 1 is a block diagram showing a schematic configuration of an embodiment of a defect inspection apparatus according to the present invention.

Hereafter, some embodiments of the present invention will be described with reference to the drawings. The following embodiments will be described by taking an inspection method called array inspection scheme as an example. In inspection using an electron beam as a charged beam, acquiring SEM images of a plurality of patterns which are inspection objects formed on a wafer, comparing obtained SEM images every pattern, and extracting a place which differs in SEM images as a defect, especially the inspection method called array inspection scheme intends for inspection of periodically arranged patterns such as cell patterns and comparison between adjacent patterns is conducted for inspection according to the method. In the attached drawings, like parts are denoted by same reference numerals and their repetitive descriptions will be appropriately omitted.

(1) Embodiment of Defect Inspection Apparatus

FIG. 1 is a block diagram showing a schematic configuration of an embodiment of a defect inspection apparatus according to the present invention. A defect inspection apparatus shown in FIG. 1 includes a scanning electron microscope 10, a control computer 40, and a monitor 30. The control computer 40 is connected to various control circuits 15 to 18, 22 and 23 in the scanning electron microscope 10 as well as the monitor 30. The control computer 40 controls the scanning electron microscope 10 via these control circuits. A storage device MR1 is connected to the control computer 40. The storage device MR1 has a plurality of storage regions. Various parameters which determine inspection conditions are stored in the storage device MR1. In addition, a recipe file which describes a series of procedures in an embodiment of a defect inspection method according to the present invention which will be described later is also stored in the storage device MR1. The control computer 40 executes defect inspection in accordance with an inspection recipe read from the recipe file. The storage device MR1 stores information for beam adjustment which will be described later and defect information of an inspection pattern in the case of re-inspection.

The monitor 30 is supplied with an image signal and the like from the control computer 40, and the monitor 30 displays a sample image of a wafer W obtained by the scanning electron microscope 10 on a liquid crystal screen or the like.

The scanning electron microscope 10 includes an electron beam column 14, a sample chamber 13, and various control circuits 15 to 18, 22 and 23. A stage 11 which supports the wafer W and an actuator 12 are provided in the sample chamber 13. The actuator 12 is connected to an actuator control circuit 18. The actuator 12 moves the stage 11 in an arbitrary direction in the X-Y horizontal plane and rotates the stage 11 by an arbitrary angle in accordance with a control signal sent from the actuator control circuit 18 under the control of the control computer 40.

Figure 12:
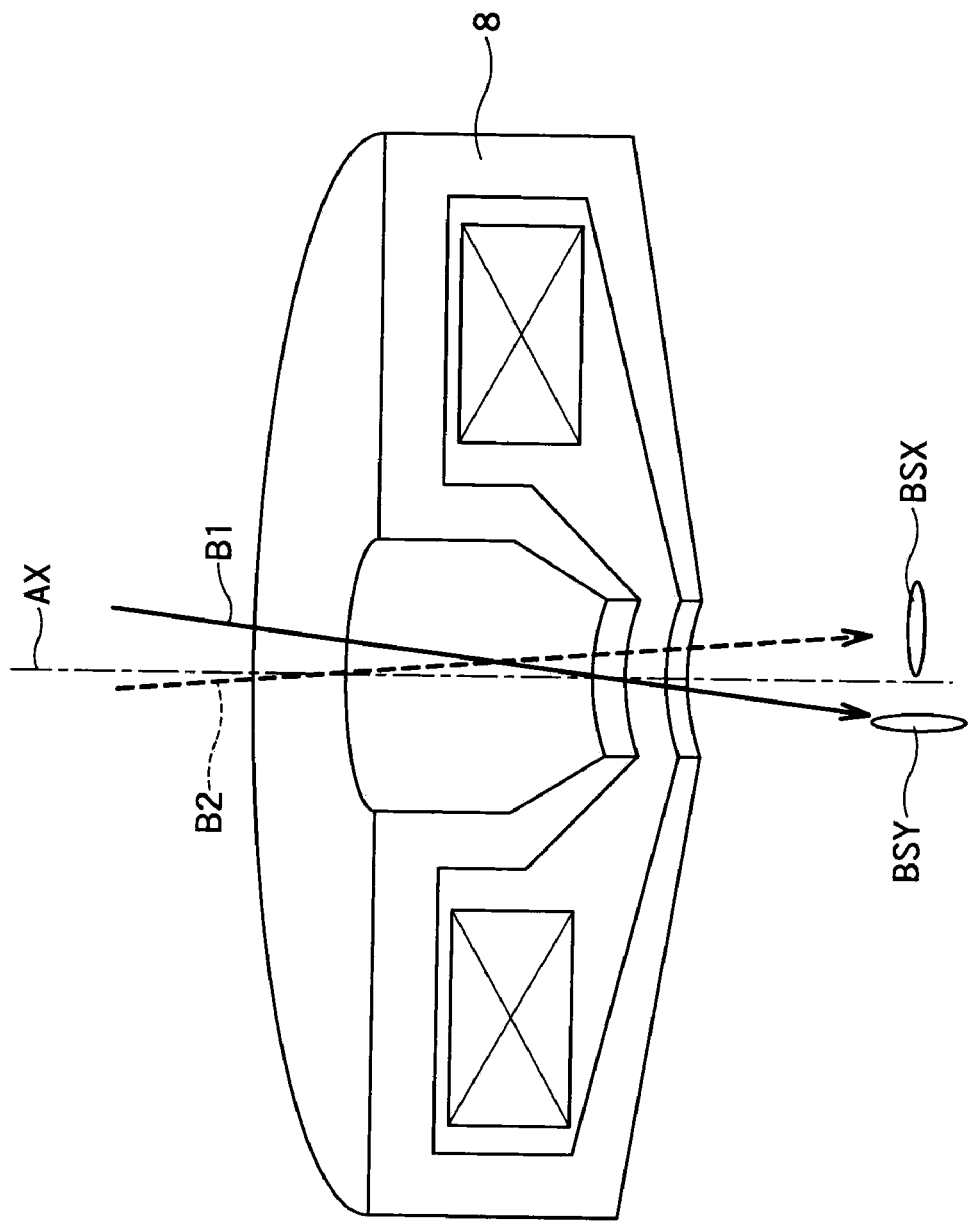
FIG. 12 is a diagram for explaining a beam shaping method in a second embodiment of a defect inspection method according to the present invention.

The electron beam column 14 includes an electron gun 1, condenser lenses 3, an aligner 4, an astigmatism corrector 5, a deflector 6, an object lens 8, and a detector 7. In the present embodiment, the electron gun 1 corresponds to, for example, a charged beam irradiation unit. The electron gun 1 is provided in an upper part of the electron beam column 14 to generate an electron beam B. The aligner 4 operates in accordance with a control signal sent from an alignment control circuit 15 which is controlled by the control computer 40, deflects the electron beam B, and adjusts the trajectory of the electron beam B so as to pass the electron beam B through a lens axis of the object lens 8 (see FIG. 12). The electron beam B emitted from the electron gun 1 is applied to the wafer W via the condenser lenses 3 and the object lens 8. The object lens 8 operates in accordance with a control signal sent from a focus control circuit 23 which is controlled by the control computer 40, and adjusts the focus of the electron beam B on the wafer W. The astigmatism corrector 5 operates in accordance with a control signal sent from an astigmatism control circuit 16 which is controlled by the control computer 40 in the same way, and corrects the astigmatism of the electron beam B on the wafer W. Furthermore, the electron beam B is deflected suitably by the deflector 6 supplied with a control signal from a scan control circuit 17 which is controlled by the control computer 40.

Due to the irradiation with the electron beam B, secondary electrons and the like 9 are generated on the surface of the wafer W. These secondary electrons and the like 9 are detected by the detector 7. After the gain is adjusted by a signal control circuit 22 which is controlled by the control computer 40, the detected signal is input from the signal control circuit 22 to the control computer 40. The control computer 40 suitably conducts image processing on the detected signal to form a sample image, and detects a defect by using the array inspection scheme. In the present embodiment, the astigmatism corrector 5, the astigmatism control circuit 16, the aligner 4, the alignment control circuit 15 and the control computer 40 correspond to, for example, a beam shape control unit. Furthermore, in the present embodiment, the secondary electrons and the like 9 correspond to, for example, charged particles. The detector 7, the signal control circuit 22 and the control computer 40 correspond to, for example, a defect detection unit.

Figure 2:
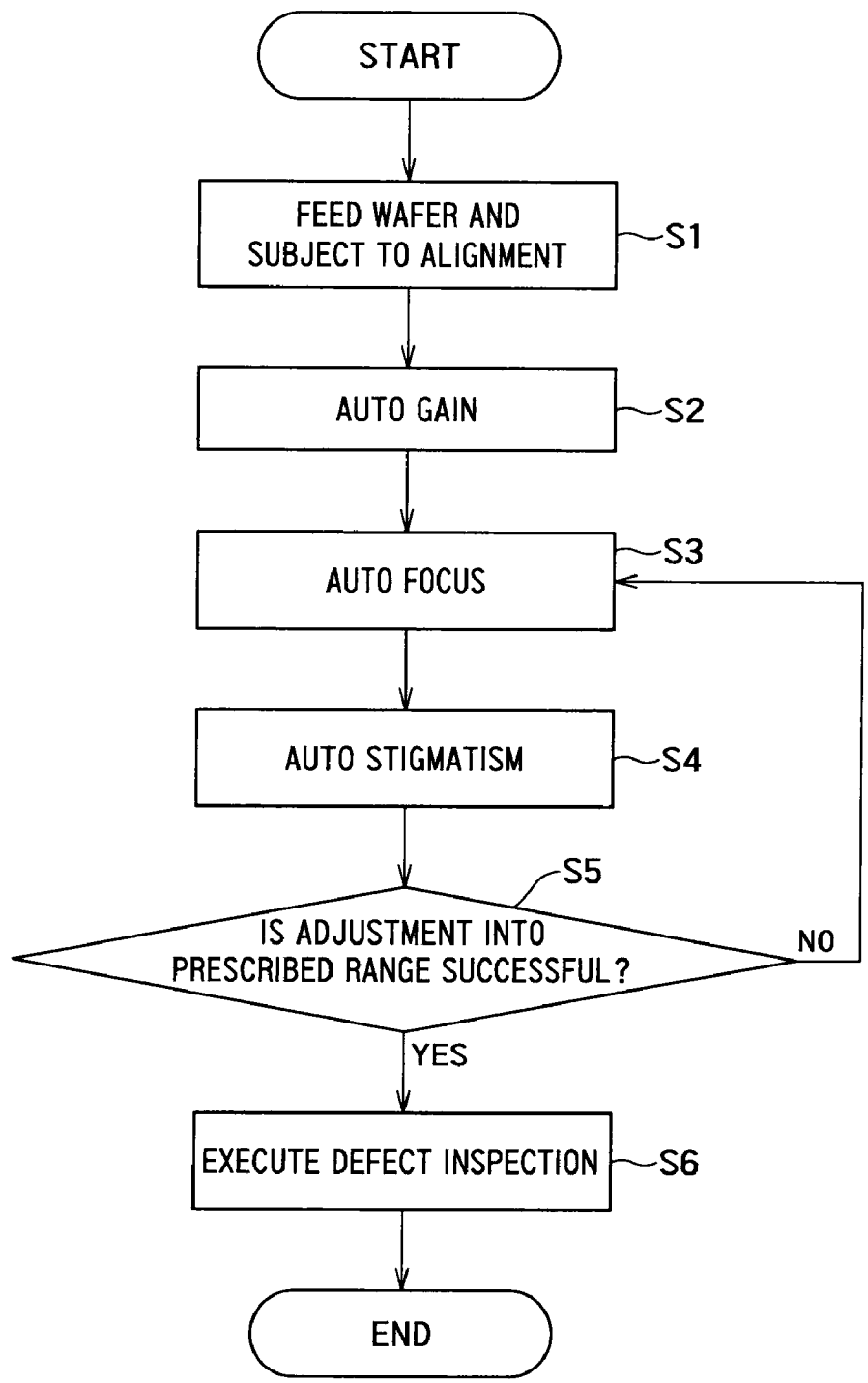
FIG. 2 is a flow chart showing a schematic configuration of an inspection sequence of the defect inspection apparatus shown in FIG. 1.

A general inspection sequence using the defect inspection apparatus shown in FIG. 1 according to the present embodiment will now be described. FIG. 2 is a flow chart showing a schematic configuration of an inspection sequence of the defect inspection apparatus shown in FIG. 1.

First, the wafer W is fed to the apparatus and subjected to alignment on the stage 11 (step S1). Immediately before entering the inspection, the gain of the detector 7 is adjusted by the signal control circuit 22 in a predetermined position of a calibration substrate which will be described in detail later (step S2). After adjustment to brightness suitable for the inspection is conducted by the auto gain, focus adjustment (focus correction) of the electron beam B applied to the wafer W is executed by the object lens 8 (step S3). In addition, stigmatism adjustment (astigmatism correction) is executed by the astigmatism corrector 5 (step S4). More specifically, the focus adjustment is executed by searching for a value of a current input to the object lens 8 which minimizes the diameter of the beam on the wafer W, and the stigmatism adjustment is executed by searching for a value of a voltage (or current) input to the astigmatism corrector 5 which causes the shape of the beam on the wafer W to become closest to the real circle shape. The control computer 40 analyzes the value obtained by the focus adjustment, the value obtained by the stigmatism adjustment, and the obtained SEM image. The acquisition of the SEM image is executed repetitively while changing the focus adjustment value and the stigmatism adjustment value. The control computer 40 conducts adjustment to an optimum value (a minimum beam diameter in the true circle) which satisfies both of these two corrected values (step S5). Upon finishing the focus adjustment and the stigmatism adjustment, the defect inspection is started (step S6). The array inspection scheme using the defect inspection apparatus according to the present embodiment is conducted specifically as hereafter described.

Figure 3:
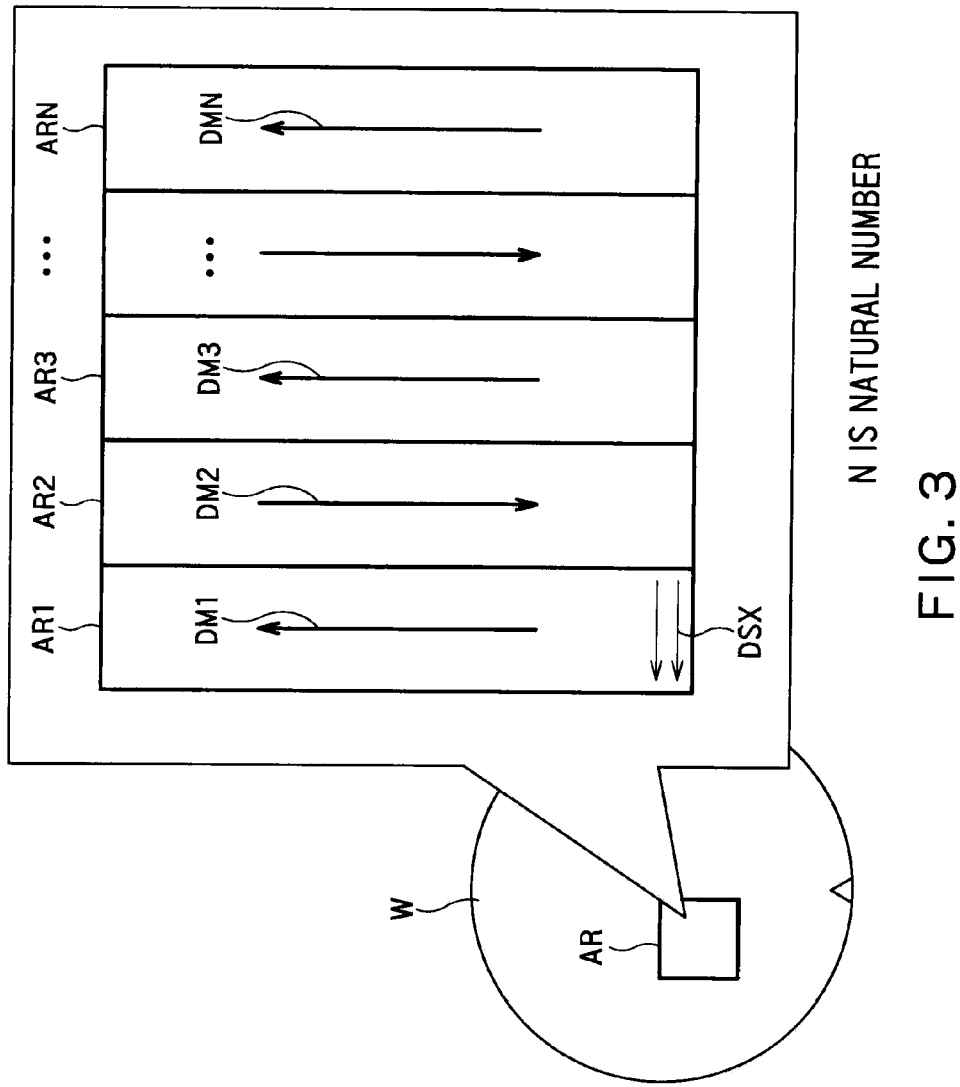
FIG. 3 is a diagram for explaining a general technique of defect inspection in the inspection sequence shown in FIG. 2.

When a continuous scan mode is adopted, the stage is moved continuously in a direction (stage movement direction DM1) perpendicular to a beam scanning direction DSX while scanning the inside of a sub-area AR1 in an inspection area AR specified on the wafer W with the electron beam B set to conditions specified on the recipe as shown in, for example, FIG. 3. In this way, SEM images in the sub-area AR1 are consecutively acquired. It is to be noted that the scanning direction DSX here means the horizontal scanning direction at the time of raster scan in which bean scan is conducted fast. Subsequently, the stage is moved continuously in a direction opposite to the stage movement direction DM1 in the sub-area AR1 while scanning the inside of a sub-area AR2. Thus, SEM images in the sub-area AR2 are consecutively acquired. Afterward, by the same sequence, SEM images of the inspection area AR are acquired in series from a sub-area AR3 up to ARN one after another.

Alternatively, when a step and scan mode is adopted, explaining with reference to the example of FIG. 3, a SEM image is acquired by scanning a view field on the lower end of the sub-area AR1 in the inspection area AR specified on the wafer W with the electron beam B set to conditions specified on the recipe. After this scanning, the stage is moved in the stage movement direction DM1, the view field coming after the stage movement is scanned with the electron beam B in the horizontal direction DSX, and a SEM image is thus acquired. After SEM images of the sub-area AR1 are obtained by repeating the above sequence, a view field on the top end of the sub-area AR2 is scanned with the electron beam B in the horizontal direction DSX, and a SEM image is thus acquired. By repeating the above sequence, SEM images of the sub-area AR2 are obtained. Afterward, by the same sequence, SEM images of the inspection area AR are acquired in series from a sub-area AR3 up to ARN one after another.

The control computer 40 calculates differences between adjacent images in the acquired SEM images successively, judges a defect to be present if the calculated difference exceeds a predetermined threshold, and outputs defect information such as defect coordinates and a defect image.

A characteristic defect inspection method used by the defect inspection apparatus shown in FIG. 1 will now be described as an embodiment of a defect inspection method according to the present invention with reference to FIGS. 4 to 12.

(2) First Embodiment of Defect Inspection Method

Figure 4:
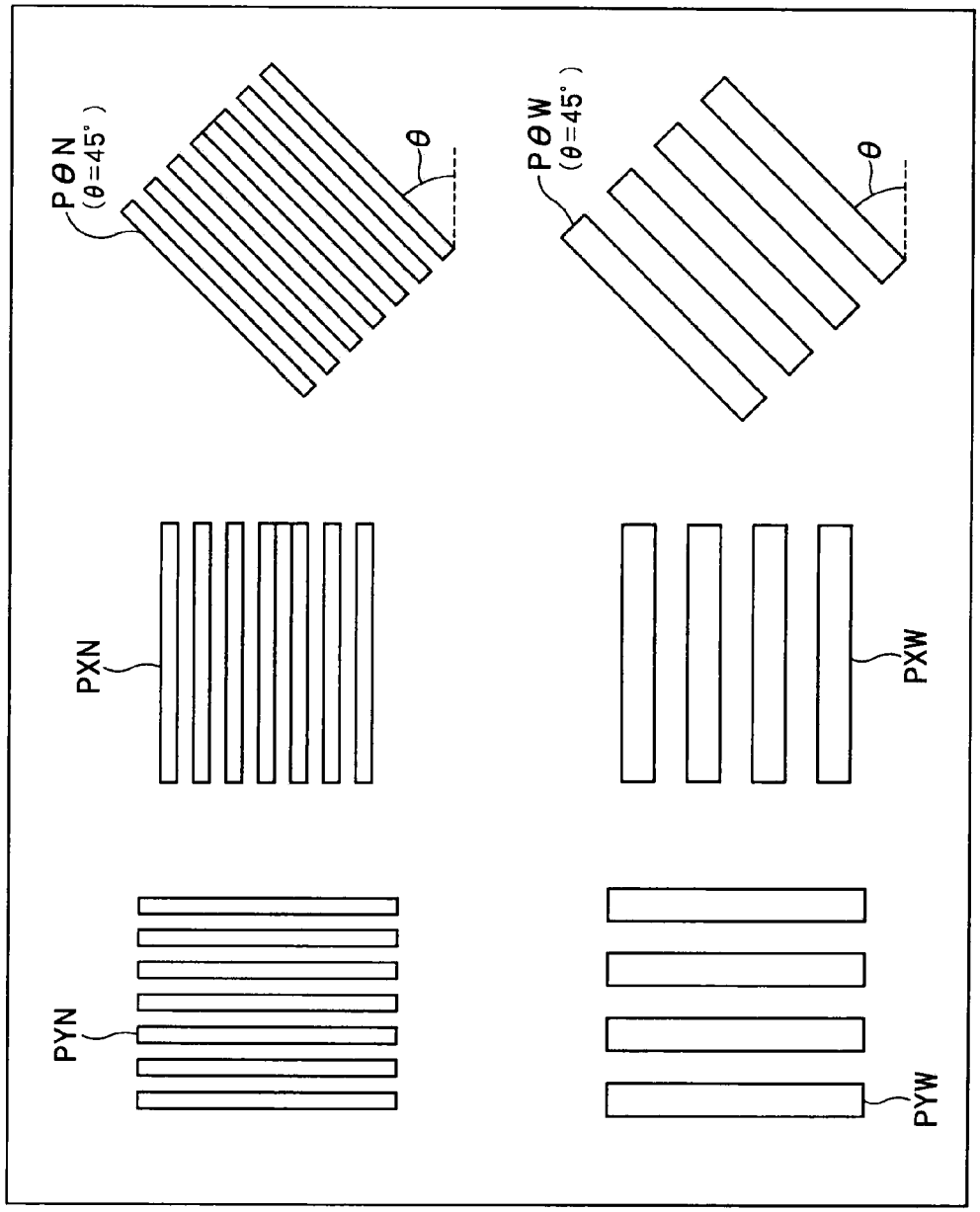
FIG. 4 is a plan view showing specific examples of a pattern for stigmatism adjustment.

First, the control computer 40 previously specifies a direction (the X direction, the Y direction, or a direction which forms an angle θ with the X direction or the Y direction) which needs resolution in the inspection based on information for the beam adjustment and defect information stored in the storage device MR1. In addition, the control computer 40 conducts beam correction so as to make the beam width right over the wafer W in the specified direction smaller than the beam width in other directions while substantially keeping the cross-sectional area of the electron beam B without expanding it at the time of the stigmatism adjustment. In the present embodiment, stigmatism adjustment (beam shaping) is conducted by controlling the astigmatism corrector 5 via the astigmatism control circuit 16 so as to cause the secondary electron profile of a pattern in the direction which needs resolution in the SEM image obtained in the stigmatism adjustment position to become the sharpest. The stigmatism adjustment may be conducted based on gray level distribution of pixels contained in an image. In addition, if a pattern for adjustment is used, the precision of the stigmatism adjustment is improved. As for the pattern for adjustment, for example, a substrate for calibration is disposed in a corner of the stage 11 separately from a substrate to be inspected. FIG. 4 is a plan view showing specific examples of a pattern for stigmatism adjustment. Line and space patterns (hereafter referred to simply as "L/S patterns") PYN and PYW are intended for improving the resolution in the X direction. L/S patterns PXN and PXW are intended for improving the resolution in the Y direction. L/S patterns PθN and PθW are intended for improving the resolution in a direction perpendicular to a direction of an angle which forms θ with the horizontal direction in the sheet of FIG. 4. In the example shown in FIG. 4, θ=45°. When an electron beam of a large current is used, a small L/S pattern dimension causes a problem that the adjustment becomes difficult and a sufficient adjustment precision cannot be obtained. Therefore, it is desirable to prepare patterns formed with dimensions according to conditions in use. PYW, PXW and POW shown in the lower part of FIG. 4 are patterns for large current, and PYW, PXW and POW are smaller in pattern dimension than PYN, PXN and PθN shown in the upper part, respectively.

Figure 5:
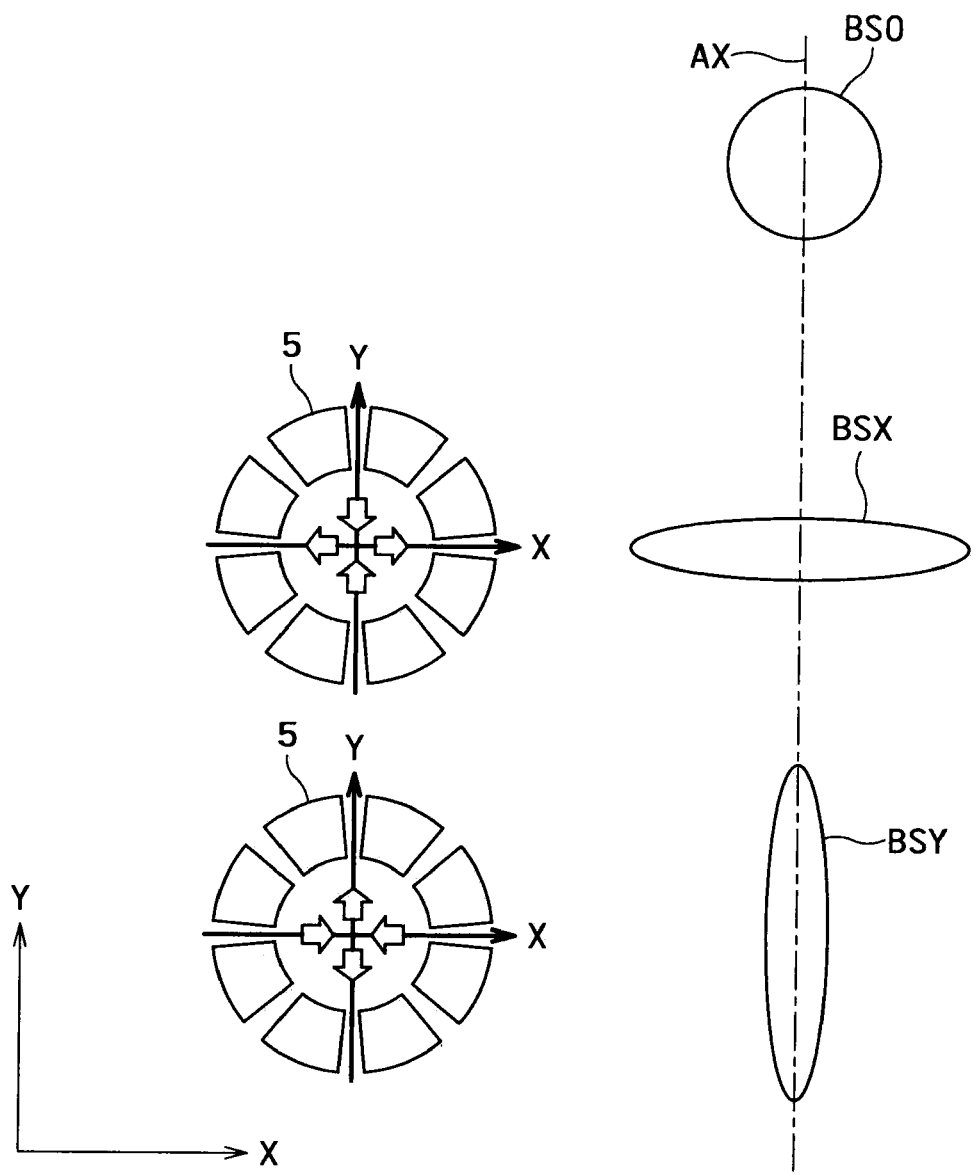
FIG. 5 is a plan view showing an example of beam shaping conducted by an example of an electrostatic astigmatism corrector.

FIG. 5 is a plan view showing an example of beam shaping conducted by an example of an electrostatic astigmatism corrector. Relations between directions (short and wide arrows) of force applied to the electron beam B by an electric field which is generated by the astigmatism corrector 5 and beam shapes BSX and BSY on the wafer W are also shown in FIG. 5. The beam shape BSX is a beam shape which improves the resolution in the Y direction, and the beam shape BSY represents an example of a beam shape which improves the resolution in the X direction.

For reference, a sectional shape BSO of the electron beam B before correction is also shown in FIG. 5. Before the correction, the electron beam B is set to take the shape of a true circle which is rotational symmetric.

The reason why the sectional shape of the electron beam B in the initial setting is a true circle which is rotational symmetric in this way is to remove the astigmatism. In other words, this is because the inspection pattern looks asymmetric if there is astigmatism in the apparatus of the SEM scheme. More specifically, the resolution in only the major axis direction of the beam falls. If, for example, a pattern taking the shape of a true circle is observed, then a phenomenon that the pattern looks elliptical occurs. It has been a technical common sense to conduct correction by using the astigmatism corrector so as to cause the section of the electron beam to take the shape of a true circle to prevent the SEM image from becoming asymmetric in this way.

According to the object and purpose of observation, however, there is a direction in which resolution is demanded intensely and there is a direction in which resolution is not demanded so much. If the resolution is improved in the necessary direction in such a case, no problem is posed even if the resolution falls in another direction. Paying attention to this point, it has occurred to the present inventor to actively utilize technical means that have never been adopted by conventional engineers in order to solve the above-described problems.

Only elliptical beam shapes BSX and BSY respectively having major axis in the X direction and the Y direction are shown in FIG. 5. In the present embodiment, the beam shape is never limited to them. It is possible to select a beam width in an arbitrary direction in the whole range of 360° by using the astigmatism corrector 5. As regards a direction different from the specified direction (especially a direction perpendicular to the specified direction) at this time, it does not matter if the resolution is lowered by a beam width which has become large.

An elliptical shaped beam having a minor axis in the direction in which the resolution is more needed is obtained by the above-described correction. It becomes possible to improve only the resolution in the minor axis direction by using the obtained elliptical-shaped beam, conducting scanning with the electron beam B in the major axis direction, and acquiring an SEM image while moving the stage 11 in the minor axis direction.

Figure 6:
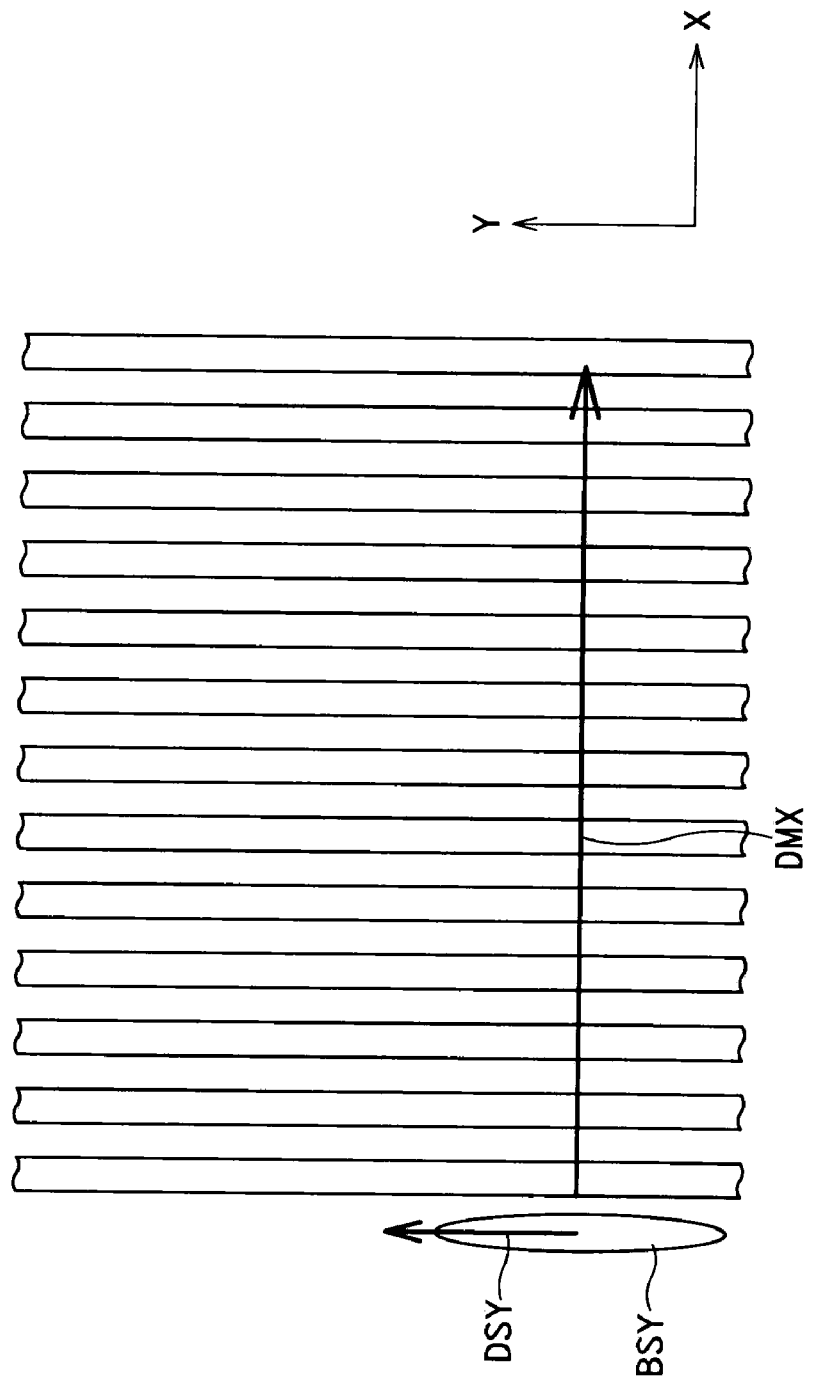
FIG. 6 shows an example in which a first embodiment of a defect inspection method according to the present invention is applied to an L/S pattern.
Figure 7:
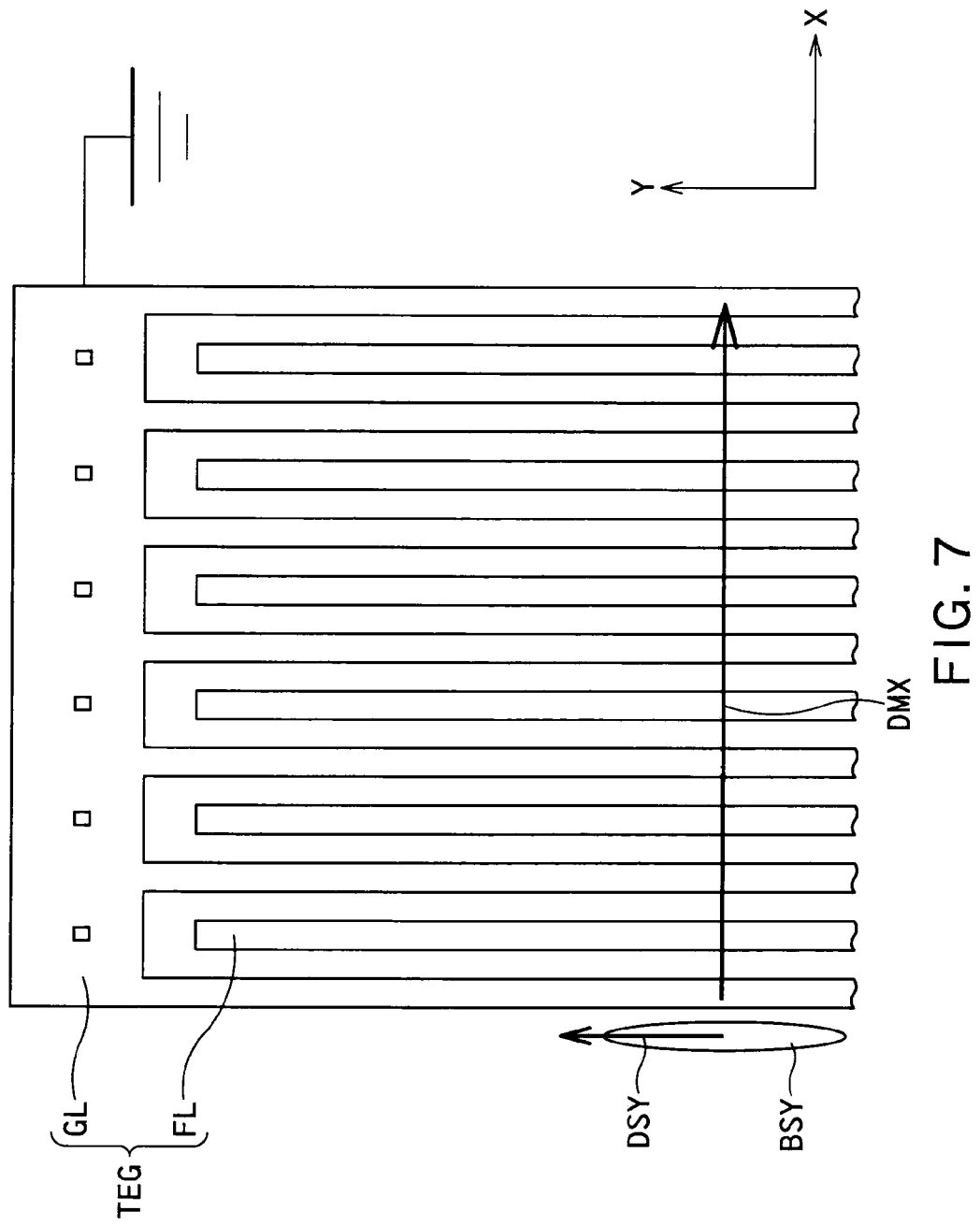
FIG. 7 is a diagram showing an example in which the first embodiment of the defect inspection method according to the present invention is applied to a technique for inspecting open circuits and short circuits between lines based on voltage contrast by using a TEG structure having ground lines and floating lines arranged alternately.

FIG. 6 shows an example in which the defect inspection method according to the present embodiment is applied to L/S patterns. In the example shown in FIG. 6, the resolution between lines is needed more than in the direction along the lines. Therefore, the resolution between lines in the X direction can be improved by shaping the sectional shape of the electron beam B on the wafer W to an elliptical shape BSY having a major axis in the Y direction in FIG. 6 and setting the beam scanning direction to DSY in the Y direction. If this technique is applied to a technique for inspecting the open circuits and short circuits between lines with a high sensitivity by means of the voltage contrast by using a TEG structure including ground lines GL and floating lines FL arranged alternately as shown in FIG. 7 (J. Shaw, R. Guldi, T. Kim, D. Corum, et al., IEEE International Interconnect Technology Conference, June 2002), then the inspection sensitivity is improved remarkably, resulting in an especially great effect. The direction indicated by characters DMX in FIG. 6 is the movement direction of the stage 11. This holds true in FIGS. 7 to 11 as well. In the examples shown in FIGS. 6 and 7, the direction DMX corresponds to, for example, a first direction and the direction DSY corresponds to, for example, a second direction.

Figure 8:
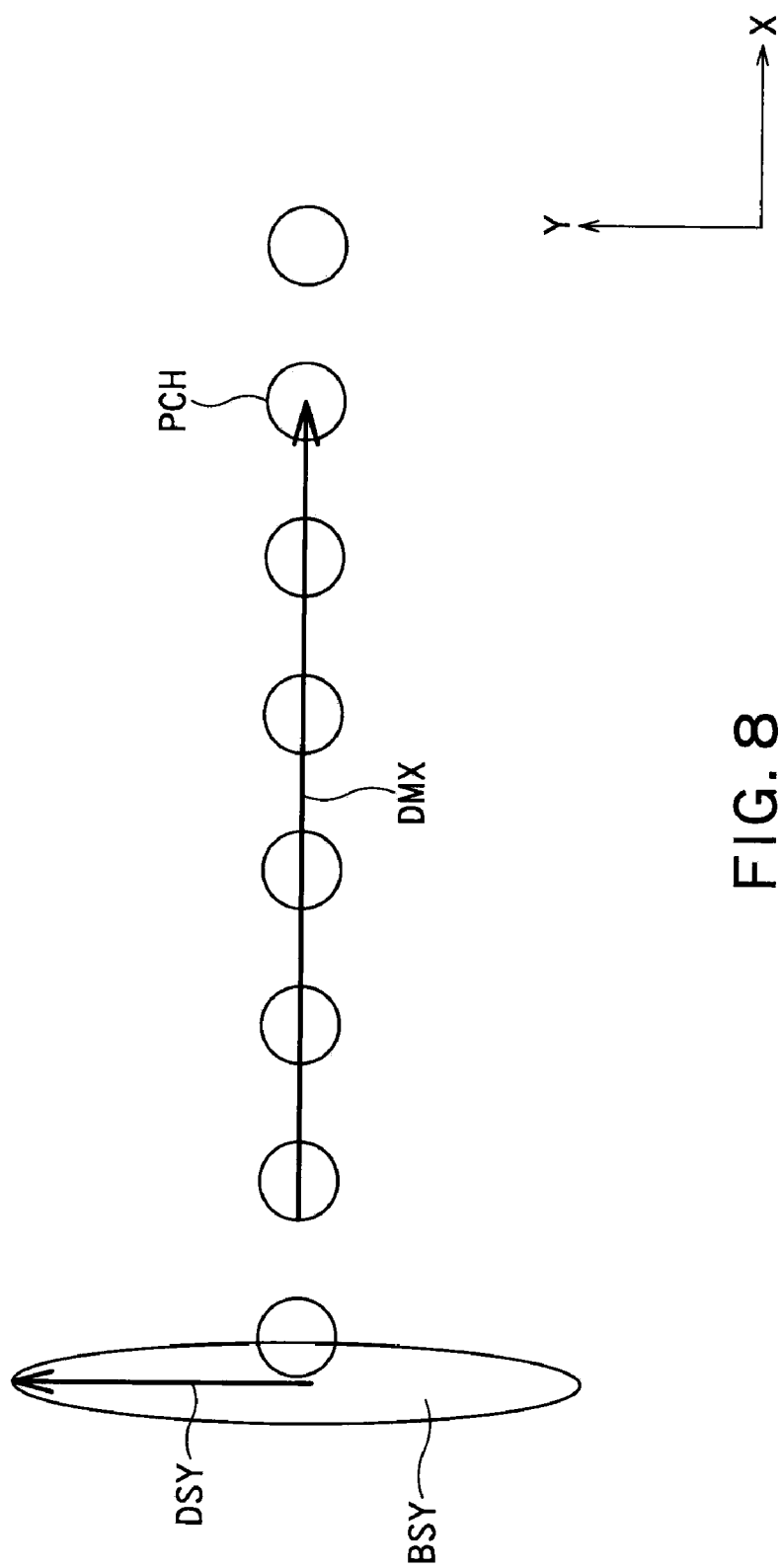
FIG. 8 is a diagram showing an example in which a first embodiment of a defect inspection method according to the present invention is applied to a C/H pattern.
Figure 9:
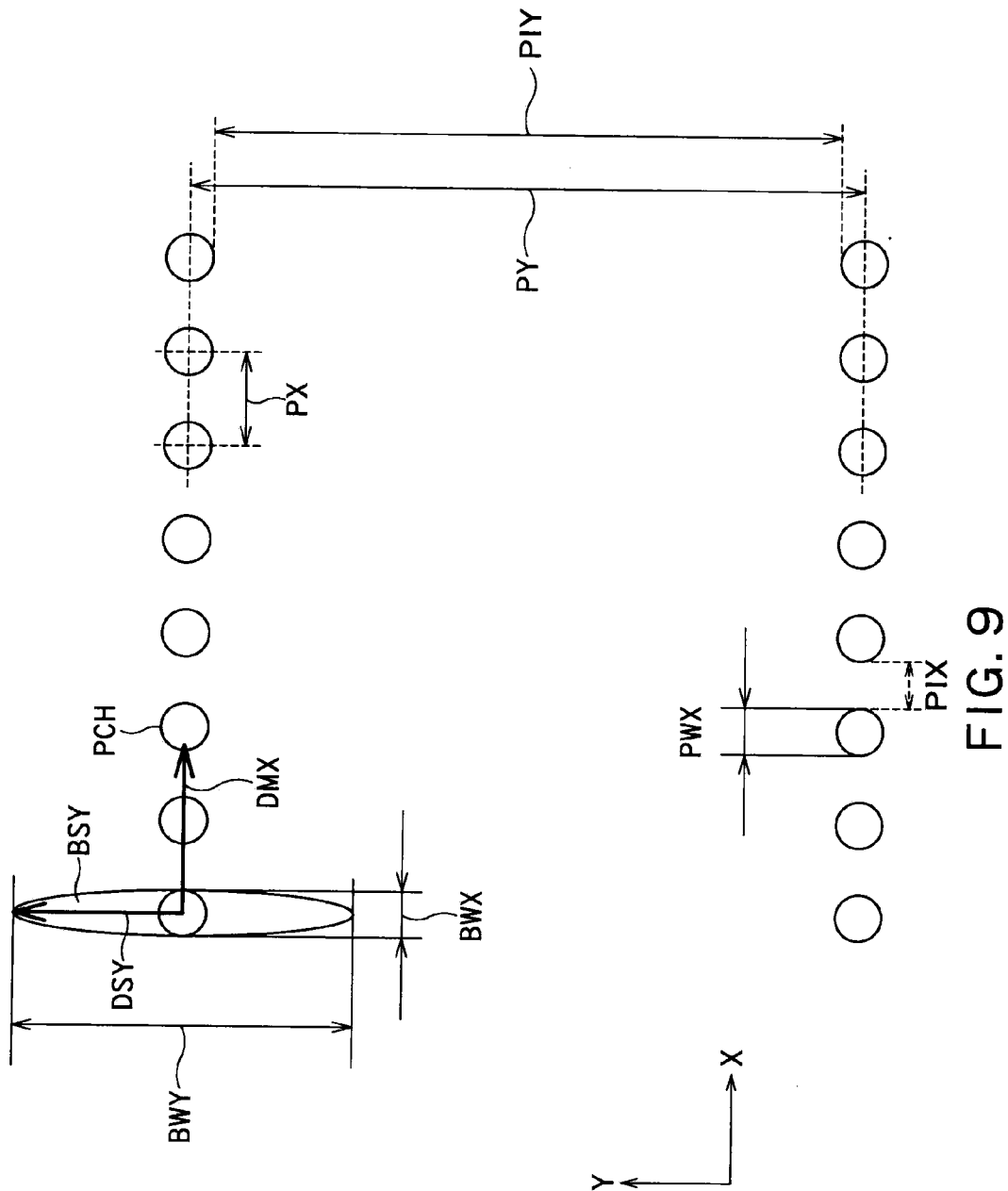
FIG. 9 is a diagram showing another example in which the first embodiment of the defect inspection method according to the present invention is applied to a C/H pattern.

Examples in which the defect inspection method according to the present embodiment is applied to contact hole (hereafter referred to simply as "C/H") patterns are shown in FIGS. 8 and 9. As for C/H patterns PCH as well, the short axis direction of the elliptical shaped beam should be set to the minimum pattern pitch direction of the pattern in the inspection region in the same way as the L/S patterns. More specifically, the resolution between C/Hs can be improved in the example shown in FIG. 8 by shaping the beam shape so as to cause the beam width in the X direction in which the C/H patterns PCH are arranged to become smaller than the beam width in other directions as in the beam section shape BSY.

The case where the C/H patterns PCH are arranged in a two-dimensional manner and pattern pitches exist in two directions which are orthogonal to each other will now be described. For example, in the example shown in FIG. 9, there are a pattern interval PIY in the Y direction perpendicular to the X direction and a pattern pitch PY in the Y direction besides a pattern interval PIX in the X direction and a pattern pitch PX in the X direction. A direction in which the interval between adjacent patterns is minimized is determined to be the short axis direction of the elliptical shaped beam. Comparing the interval PIX in the X direction between adjacent C/H patterns with the interval PIY in the Y direction, PIX is smaller than PIY in the example shown in FIG. 9. Therefore, the direction in which the interval between the adjacent C/H patterns is minimized is the direction of PIX, and this direction is set as the short axis direction of the elliptical shaped beam.

If the beam sectional shape BSY on the wafer W is set so as to cause a beam width BWY in the major axis direction to become less than the pattern interval PIY in the major axis direction in the inspection region, then signals on adjacent C/H patterns PCH in the major axis direction can be prevented from being overlapped and consequently the inspection sensitivity can be prevented from falling.

In the same manner, a case where the X direction is set as the major axis direction, the beam sectional shape on the wafer W is denoted by BSX (not illustrated) and the beam width in the major axis direction is denoted by BWX is cited. If the beam width BWX is set so as to become less than the pattern interval PIX in the minor axis direction in the inspection region, then signals on adjacent C/H patterns PCH in the minor axis direction can be prevented from being overlapped and consequently the inspection sensitivity can be prevented from falling.

Furthermore, image degradation can be prevented by setting the beam width of the elliptical shaped beam in the minor axis direction so as to become less than the dimension of one pixel in forming a sample image by suitably conducting image processing on a detected signal obtained by beam-scanning of the C/H patterns PCH.

In the examples shown in FIGS. 6 and 7, the direction DMX corresponds to, for example, a first direction and the direction DSY corresponds to, for example, a second direction.

Figure 10B:
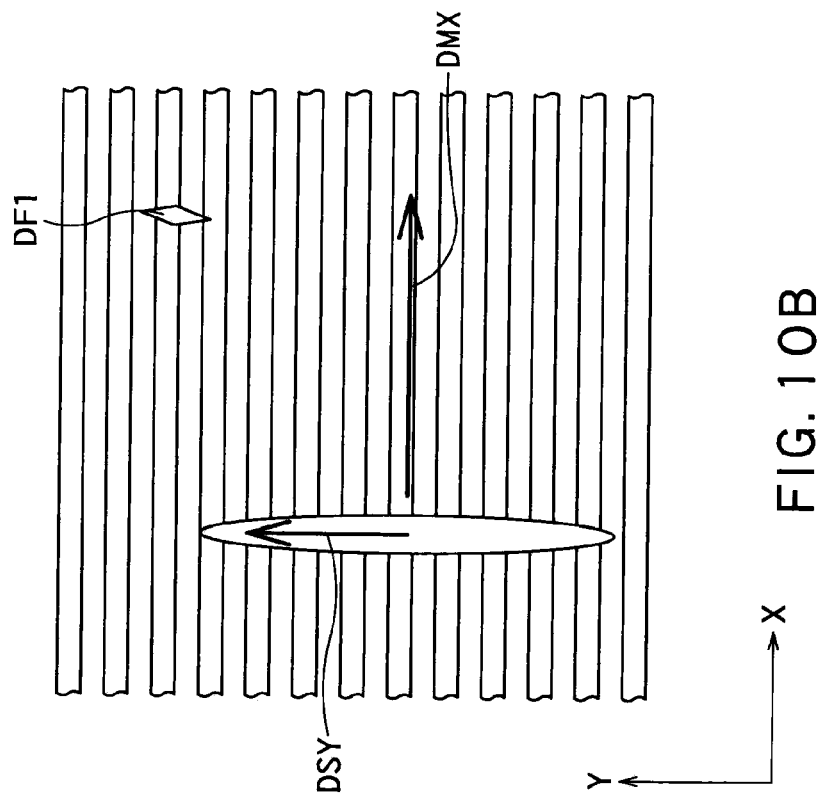
FIGS. 10A and 10B are diagrams showing detection examples in the case where a defect which is found to exist on an L/S pattern, but features of which are indistinct is to be inspected.
Figure 10A:
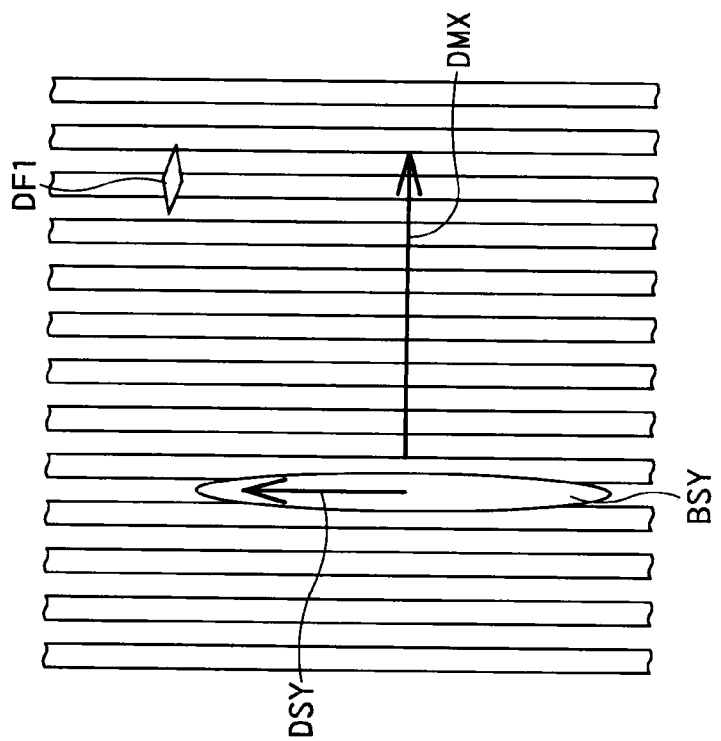

FIGS. 10A and 10B show detection examples for a defect DF1 which is found to exist on the L/S patterns, but features of which are unknown. The electron beam B having the elliptical shape BSY has its resolution in only one direction. Therefore, the defect can be detected with a very high sensitivity by scanning in the scanning direction DSY with the electron beam B and conducting inspection as shown in FIG. 10A, then rotating the wafer W by 90° and conducting inspection under the same condition as shown in FIG. 10B, thereby obtaining two inspection results. As a matter of course, the rotation angle of the inspection object is not restricted to 90° at all, but the rotation angle may be an arbitrary angle θ. In the examples shown in FIGS. 10A and 10B as well, the direction DMX corresponds to, for example, a first direction and the direction DSY corresponds to, for example, a second direction.

Figure 11B:
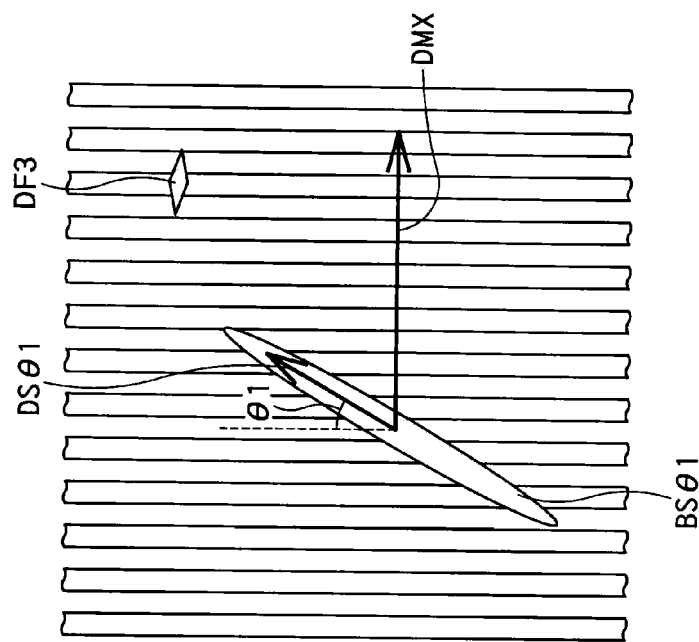
FIGS. 11A and 11B are diagrams showing another detection example in the case where a defect which is found to exist on an L/S pattern, but features of which are indistinct is to be inspected.
Figure 11A:
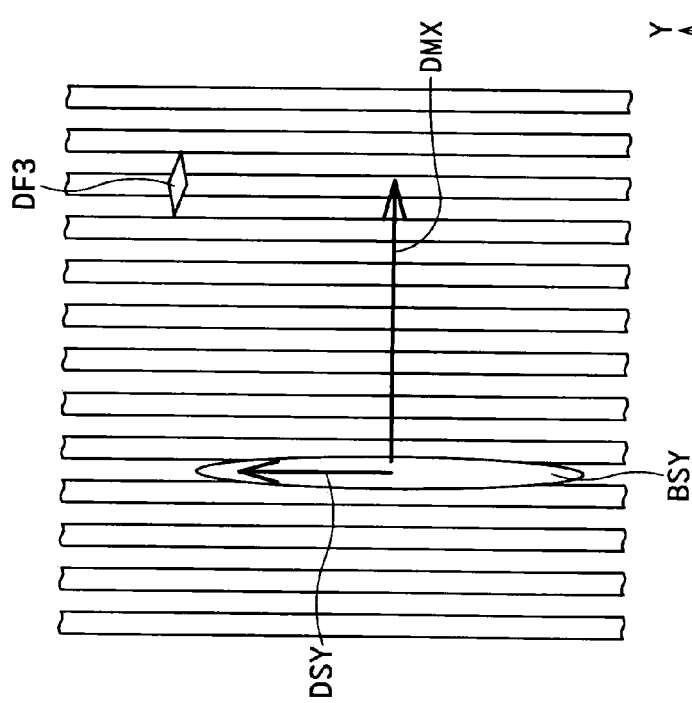

FIGS. 11A and 11B also show detection examples for a defect DF3 which is found to exist on the L/S patterns, but features of which are unknown. The defect can be detected with a very high sensitivity by scanning in the scanning direction DSY with the electron beam B having a sectional shape BSY on the wafer W and conducting inspection as shown in FIG. 11A, then rotating the electron beam B by θ1 to form a sectional shape BSθ1 and scanning the wafer W in the scanning direction DSθ1 and conducting inspection as shown in FIG. 11B. As a matter of course, the rotation angle θ1 may be an arbitrary angle in the examples shown in FIGS. 11A and 11B as well. In the example shown in FIG. 11A, the direction DMX corresponds to, for example, a first direction and the direction DSY corresponds to, for example, a second direction. In the example shown in FIG. 11B, the direction DSθ1 corresponds to, for example, a second direction.

According to the defect inspection method in the present embodiment, the resolution of the inspection image can be improved for the following two reasons.

(i) Since the distance between electrons can be made large in a direction in which resolution falling can be permitted right over the wafer where the current density is the highest, the space charge effect can be suppressed. Therefore, the electron beam in the short axis direction of the ellipse can be narrowed down.

(ii) In the astigmatism correction, high correction precision is obtained by narrowing down correction to one direction.

(3) Second Embodiment of Defect Inspection Method

A feature point of the defect inspection method according to the present embodiment is that the elliptical shaped beam is obtained by causing the aligner 4 to adjust alignment of the electron beam B with the object lens 8. Other points are substantially the same as those of the first embodiment.

As for the alignment with the object lens 8, adjustment is conducted so as to pass the electron B through the vicinity of the center of the object lens 8 by using the aligner 4 disposed between the electron gun 1 and the object lens 8. At this time, the beam incidence position and the incidence angle to the object lens 8 are adjusted so as to minimize the beam width in a specified direction on the wafer W. In the example shown in FIG. 12, when the electron beam is applied from diagonally upper right in the sheet of FIG. 12 to the object lens 8, an electron beam B1 having an elliptical section shape BSY in which the X direction is the short axis direction is obtained. On the other hand, when the electron beam is applied from diagonally upper left in the sheet of FIG. 12 to the object lens 8, an electron beam B2 having an elliptical section shape BSX in which the Y direction is the short axis direction is obtained.

(4) Program

It is also possible to incorporate the series of procedures of the defect inspection method mentioned above into a program and cause a computer which can conduct image processing to read and execute the program. As a result, it is possible to implement the defect inspection method according to the present invention by using a general-purpose computer. Furthermore, it is also possible to store the series of procedures of the defect inspection method mentioned above into a recording medium such as a flexible disk or a CD-ROM as a program to be executed by a computer and cause the computer to read and execute the program.

The recording medium is not restricted to a portable one such as a magnetic disk or an optical disk, but may be a stationary recording medium such as a hard disk device or a memory. Furthermore, a program incorporating the above-mentioned series of procedures of the defect inspection method may be distributed via a communication line (including wireless communication) such as the Internet. In addition, a program incorporating the above-mentioned series of procedures of the defect inspection method may be distributed via a communication line or a wireless line such as the Internet or may be stored in a recording medium and then distributed, in the state in which the program is encrypted, modulated and compressed.

(5) Semiconductor Device Manufacturing Method

Defects can be inspected at high speed and with high resolution by using the above-described defect inspection method in the manufacturing process of semiconductor devices. As a result, semiconductor devices can be manufactured with a higher throughput and yield.

More specifically, a substrate is extracted by taking a manufacturing lot as the unit and the extracted substrate is inspected by using the above-described defect inspection method. If the substrate is judged to be an article of good quality as a result of the inspection, then the remaining manufacturing process is subsequently executed on the whole manufacture lot to which the inspected substrate belongs. On the other hand, if the substrate is judged to be an article of inferior quality as a result of the inspection and rework processing is possible, then the rework processing is executed on the manufacture lot to which the substrate judged to be an article of inferior quality. If the rework processing is finished, a substrate is extracted from the manufacture lot and subjected to the inspection again. If the extracted substrate is judged to be an article of good quality as a result of the re-inspection, then the remaining manufacturing process is executed on the manufacture lot finished in the rework processing. If the rework processing is impossible, then the manufacture lot to which the substrate judged to be an article of inferior quality belongs is discarded and a cause of the occurrence of inferiority is analyzed and fed back to a person in charge of design and a person in charge of an upstream process.

(6) Rest

Heretofore, embodiments of the present invention have been described. However, the present invention is never restricted to the embodiments, but it is a matter of course that the embodiments can be subject to various changes within the scope thereof and applied. For example, in the embodiments, the electron beam is used as the charged beam. However, the charged beam is not restricted to them. For example, it is also possible to use an ion beam. Furthermore, the embodiments have been described as regards the elliptical shaped beam. In a rectangular shaped beam as well, however, the beam width in the minor axis direction can be made small as compared with the major axis direction, and consequently similar effects can be obtained. In the embodiments, the sectional shape of the electron beam is adjusted by use of the astigmatism corrector or lens alignment. However, this is not restrictive. For example, if the tip of the electron gun is provided with a shape of an ellipse or a rectangle, then the obtained beam itself takes the shape of an ellipse or a rectangle and consequently similar effects can be obtained. In addition, if a combination of the astigmatism correction and lens alignment is used, the effect can be further enhanced.

What is claimed is:

1. A defect inspection apparatus comprising:
a charged beam irradiation unit which generates a charged beam and applies the charged beam to a sample having a plurality of patterns formed thereon;
a beam shape control unit which controls a shape of the charged beam while substantially maintaining a cross-sectional area of the beam in a manner that a beam width in a first direction perpendicular to an optical axis is smaller than a beam width in a second direction that is perpendicular to the optical axis and to the first direction;
a scanning unit which scans the sample with the charged beam having the controlled shape; and
a defect detection unit which detects charged particles generated from a surface of the sample by irradiation of the charged beam and detects a defect of the patterns,
wherein the scanning unit sets the first direction to a direction in which an interval between adjacent patterns becomes a minimum value and scans an inspection region of the sample in the second direction, and
wherein, if during scanning the sample moves in a third direction, the second direction is different from the third direction.

2. The defect inspection apparatus of claim 1, wherein the beam shape control unit controls the shape of the charged beam so as to cause the beam width in the second direction to become less than a minimum interval between adjacent patterns on the sample in the second direction.

3. The defect inspection apparatus of claim 1, wherein the beam shape control unit controls the shape of the charged beam so as to cause the beam width in the first direction to become less than a pixel dimension at time when forming an image of the patterns from charged particles detected from the inspection region.

4. The defect inspection apparatus of claim 1, wherein the beam shape control unit controls the shape of the charged beam so as to cause the beam width in the first direction to become less than a minimum interval between adjacent patterns on the sample in the first direction.

5. The defect inspection apparatus of claim 1, further comprising a sample support unit which supports the sample so as to cause the sample to be rotatable, wherein the defect detection unit conducts defect detection a plurality of times while rotating the sample by an arbitrary angle.

6. The defect inspection apparatus of claim 1, wherein the defect detection unit conducts defect detection a plurality of times while rotating the charged beam by an arbitrary angle.

7. The defect inspection apparatus of claim 1, further comprising:
an electron optic lens which adjusts a focus of the charged beam on the sample; and
an aligner which deflects the charged beam,
wherein the beam shape control unit adjusts an incidence position of the charged beam to the electron optic lens by using the aligner and thereby controls the shape of the charged beam.

8. The defect inspection apparatus of claim 1, wherein the scanning unit scans the sample with the charged beam by deflecting the charged beam and not by moving the sample.

9. The defect inspection apparatus of claim 1, wherein the defect inspection apparatus is configured to inspect the sample by a plurality of scanning the inspection region with the charged beam in the second direction, each followed by a sample movement in the first direction.

10. The defect inspection apparatus of claim 9, wherein scanning the inspection region with the charged beam in the second direction includes scanning with the charged beam an entire length of the inspection region along the second direction, and wherein during the sample movement the sample is moved by an increment of a length of the inspection region along the first direction.

11. The defect inspection apparatus of claim 1, wherein the beam shape control unit is configured to cause the beam to be an elliptical-shaped beam with a minor axis in the first direction and a major axis in the second direction, by making a first astigmatism in the first direction generated in the charged beam to be asymmetric with respect to a second astigmatism in the second direction generated in the charged beam.

12. A defect inspection method comprising:
  generating a charged beam and irradiating a sample on which a plurality of patterns are formed with the charged beam;
  controlling a shape of the charged beam applied to the sample so as to cause a beam width in a first direction perpendicular to an optical axis to be smaller than a beam width in a second direction that is perpendicular to the optical axis and to the first direction, while substantially maintaining a cross-sectional area of the beam;
  scanning the sample with the charged beam having the controlled shape; and
  detecting charged particles generated from a surface of the sample by irradiation of the charged beam and detects a defect of the patterns,
  wherein the first direction is set to a direction in which an interval between adjacent patterns becomes a minimum value and an inspection region of the sample is scanned in the second direction, and wherein, if during scanning the sample moves in a third direction, the second direction is different from the third direction.

13. The defect inspection method of claim 12, wherein the plurality of patterns are arranged periodically with a predetermined pitch at least in the first direction.

14. The defect inspection method of claim 12, wherein the beam width in the second direction is less than a minimum interval between adjacent patterns on the sample in the second direction.

15. The defect inspection method of claim 12, wherein the beam width in the first direction is less than a pixel dimension at time when forming an image of the patterns from charged particles detected from the inspection region.

16. The defect inspection method of claim 12, wherein the beam width in the first direction is less than a minimum interval between adjacent patterns on the sample in the first direction.

17. The defect inspection method of claim 12, further comprising rotating the sample or the charged beam by an arbitrary angle and conducting the defect inspection again.

18. The defect inspection method of claim 12, further comprising adjusting a focus of the charged beam on the sample using an electron optic lens, wherein the shape of the charged beam is controlled by adjusting an incidence position of the charged beam to the electron optic lens.

19. A manufacturing method for semiconductor device comprising:
  responsive to judgment that a pattern on a sample for semiconductor device formation satisfies specifications required for the semiconductor device as a result of inspection using a defect inspection method, executing a manufacturing process for the semiconductor device on the sample, the defect inspection method comprising:
  generating a charged beam and irradiating a sample on which a plurality of patterns are formed with the charged beam;
  controlling a shape of the charged beam applied to the sample so as to cause a beam width in a first direction perpendicular to an optical axis to be smaller than a beam width in a second direction that is perpendicular to the optical axis and to the first direction, while substantially maintaining a cross-sectional area of the beam;
  scanning the sample with the charged beam having the controlled shape; and
  detecting charged particles generated from a surface of the sample by irradiation of the charged beam and detects a defect of the patterns,
  wherein the first direction is set to a direction in which an interval between adjacent patterns becomes a minimum value and an inspection region of the sample is scanned in the second direction, and wherein, if during scanning the sample moves in a third direction, the second direction is different from the third direction.

20. The manufacturing method for semiconductor device according to claim 19, wherein the beam width in the second direction is less than a minimum interval between adjacent patterns in the second direction.

21. The manufacturing method for semiconductor device according to claim 19, wherein the beam width in the first direction is less than a pixel dimension at time when forming an image of the patterns from charged particles detected from the inspection region.

22. The manufacturing method for semiconductor device according to claim 19, wherein the beam width in the first direction is less than a minimum interval between adjacent patterns on the sample in the first direction.

23. The manufacturing method for semiconductor device according to claim 19, further comprising rotating the sample or the charged beam by an arbitrary angle and conducting the defect inspection again.

24. The manufacturing method for semiconductor device according to claim 19, further comprising adjusting a focus of the charged beam on the sample using an electron optic lens, wherein the shape of the charged beam is controlled by adjusting an incidence position of the charged beam to the electron optic lens.

* * * * *